United States Patent
Beidas et al.

(10) Patent No.: US 11,038,539 B1
(45) Date of Patent: Jun. 15, 2021

(54) NEAR-CAPACITY ITERATIVE DETECTION OF CO-CHANNEL INTERFERENCE FOR A HIGH-EFFICIENCY MULTIBEAM SATELLITE SYSTEM

(71) Applicants: Bassel F. Beidas, Germantown, MD (US); Rohit Iyer Seshadri, Germantown, MD (US)

(72) Inventors: Bassel F. Beidas, Germantown, MD (US); Rohit Iyer Seshadri, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 16/784,207

(22) Filed: Feb. 6, 2020

Related U.S. Application Data (60) Provisional application No. 62/939,928, filed on Nov. 25, 2019.

(51) Int. Cl.
| | |
|---|---|
| H03M 13/00 | (2006.01) |
| H03M 13/39 | (2006.01) |
| H04B 17/345 | (2015.01) |
| H04B 7/185 | (2006.01) |

(52) U.S. Cl.
CPC ... *H03M 13/3927* (2013.01); *H03M 13/3911* (2013.01); *H03M 13/3933* (2013.01); *H04B 7/18513* (2013.01); *H04B 17/345* (2015.01)

(58) Field of Classification Search
None
See application file for complete search history.

(56) References Cited

U.S. PATENT DOCUMENTS

| | | | |
|---|---|---|---|
| 8,385,439 B2* | 2/2013 | Djordjevic | H04L 1/0631 375/260 |
| 2006/0182194 A1 | 8/2006 | Miller | |
| 2007/0207727 A1* | 9/2007 | Song | H04L 12/1877 455/3.06 |
| 2008/0225799 A1* | 9/2008 | Lee | H04H 20/26 370/332 |

(Continued)

OTHER PUBLICATIONS

B. Devillers, A. Perez-Neira and C. Mosquera, "Joint Linear Precoding and Beamforming for the Forward Link of Multi-Beam Broadband Satellite Systems," 2011 IEEE Global Telecommunications Conference—GLOBECOM 2011, Kathmandu, 2011, pp. 1-6.

(Continued)

*Primary Examiner* — Mujtaba M Chaudry
(74) *Attorney, Agent, or Firm* — Capitol City Techlaw; Jasbir Singh (57) ABSTRACT

A communications apparatus to receive a composite signal including a desired signal and interferer signals, where the desired signal may include desired symbols and the interferer signals may include interferer symbols. The system may include N frameworks, each framework may include a detector to partition the desired symbols and the interferer symbols based on an interference severity into a dominant group and a non-dominant group, and to generate A Posteriori Probabilities (APP) of the desired symbols and the interferer symbols. The detector of each of the N frameworks generates the APP based on a feedback of a priori probabilities from each of the N frameworks.

20 Claims, 4 Drawing Sheets

(56) References Cited

U.S. PATENT DOCUMENTS

| | | | |
|---|---|---|---|
| 2012/0114084 A1 | 5/2012 | Choi et al. | |
| 2013/0288629 A1* | 10/2013 | Balraj | H04B 17/345 |
| | | | 455/226.3 |
| 2015/0381392 A1 | 12/2015 | Beidas et al. | |
| 2017/0238317 A1* | 8/2017 | Choi | H04L 25/0228 |
| | | | 375/341 |
| 2018/0192310 A1* | 7/2018 | Zhuang | H04B 7/0626 |

OTHER PUBLICATIONS

G. Cocco, M. Angelone, A. I. Pérez-Neira, "Co-channel interference cancellation at the user terminal in multibeam satellite systems", Int. J. Satellite Commun. Netw., vol. 35, No. 1, pp. 45-65, 2017.

G. Colavolpe, A. Modenini, A. Piemontese, A. Ugolini, "Multiuser Detection in Multibeam Satellite Systems: Theoretical Analysis and Practical Schemes", Communications IEEE Transactions on, vol. 65, No. 2, pp. 945-955, 2017.

M. Angelone, A. Ginesi, M. Caus, A. I. Pérez-Neira, J. Ebert, "System Performance of an Advanced Multi-User Detection Technique for High Throughput Satellite Systems", 21st Ka and Broadband Communications Conference, Oct. 2015.

M. Caus, A. I. Perez-Neira, M. Angelone and A. Ginesi, "An innovative interference mitigation approach for high throughput satellite systems," 2015 IEEE 16th International Workshop on Signal Processing Advances in Wireless Communications (SPAWC), Stockholm, 2015, pp. 515-519.

N. A. K. Beigi and M. R. Soleymani, "Increasing Bandwidth Efficiency in Multibeam Satellite Systems under Interterence Limited Condition Using Overlay Coding," 2017 IEEE 85th Vehicular Technology Conference (VTC Spring), Sydney, NSW, 2017, pp. 1-5.

S. Andrenacci et al., "Physical layer performance of multi-user detection in broadband multi-beam systems based on DVB-S2", Proc. Eur. Wireless (EW), pp. 1-5, May 2014.

W. Nam, D. Bai, J. Lee, I. Kang, "Advanced interference management for 5G cellular networks", IEEE Commun. Mag., vol. 52, No. 5, pp. 52-60, May 2014.

International search report in corresponding PCT Application No. PCT/US2020/060143.

* cited by examiner

NEAR-CAPACITY ITERATIVE DETECTION OF CO-CHANNEL INTERFERENCE FOR A HIGH-EFFICIENCY MULTIBEAM SATELLITE SYSTEM

CROSS-REFERENCE TO RELATED APPLICATIONS AND INCORPORATION BY REFERENCE

The present application claims the benefit under 35 U.S.C. 119(e) of U.S. Provisional Application Ser. No. 62/939,928, filed Nov. 25, 2019, which is incorporated herein by reference in its entirety.

FIELD

A receiver to improve spectral efficiency in a multibeam satellite system with Co Channel Interference (CCI), in particular, systems that employ aggressive frequency reuse. The receiver successfully mitigates CCI by compensating for memory effects compounding the CCI which are unavoidable in a multibeam satellite system. The receiver may be deployed at a user terminal. In the present teachings, an exemplary receiver is presented for satellite applications; however, the receiver of the present teachings may be applied in other radio communications systems, such as cellular (e.g., 4G, LTE, or 5G) and WiFi.

BACKGROUND

In the prior art, precoding and beamforming techniques are limited by the accuracy of Channel State Information (CSI) information available at the gateway. Additionally, precoding techniques are also limited by the lack of feeder-link bandwidth. Compensating for CCI at a receiver, for example, a user terminal, overcomes the above limitations.

A multibeam satellite system employs frequency reuse in which different beams share the same frequency resource or bandwidth. Beams sharing bandwidth are known as co-channel beams. The closer the two co-channel beams are located geographically, the greater is the co-channel interference (CCI). CCI can have devastating impact on the performance, hence prior art systems maintain CCI at acceptable levels by typically employing a reuse factor of 4, illustrated in FIG. 1, where the total system bandwidth B is divided into two parts on each antenna polarization, such that each beam has bandwidth of B/2.

Figure 1:
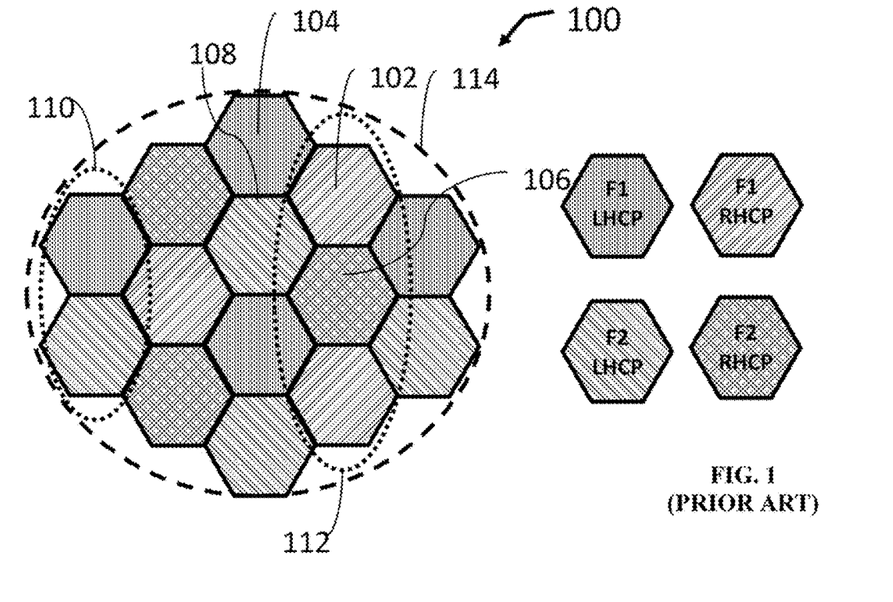
FIG. 1 illustrates a prior art beam laydown pattern with a 4-color reuse plan for a multi-beam satellite, according to various embodiments.

FIG. 1 illustrates a prior art beam laydown pattern with a 4-reuse plan for a multi-beam satellite, according to various embodiments.

FIG. 1 illustrates a reuse plan combining signal polarization and non-overlapping frequency spectrums to create a 4-reuse plan 100. In the example, the four colors (hashing in FIG. 1) correspond to four different frequency/polarization allocations. An available frequency spectrum is divided into two frequency sub-bands—F1 and F2—and each sub-band is assigned/mapped to a different color, and two orthogonal polarizations are assigned/mapped colors to provide the two other colors in the 4-color reuse plan. A service or coverage area 114 may be divided into cells. Multi-beam satellites typically illuminate multiple hexagonal cells within a service area 114. In exemplary embodiments, a cell 102 may be illuminated by a far field beam pattern in band F1 using a right hand circular polarization (RHCP), a cell 104 in band F1 may be illuminated by a far field beam pattern in band F1 using a left hand circular polarization (LHCP), a cell 106 may be illuminated by a far field beam pattern in F2 using a RHCP and a cell 108 which may be illuminated by a far field beam pattern in F2 using a LHCP A multi-beam satellite implementing a reuse plan may arrange the two polarizations in separate alternate rows, for example, a LHCP row 110 and a RHCP row 112. It is possible to tessellate a desired coverage area, such as, earth's surface, using an Nc color reuse tessellate where Nc is any positive natural number. A one-color and two-color is also known. Moreover, a 3 or 7-color reuse plan, each of which use both polarizations, is also known.

The very high capacity required by the next generation of broadband satellites makes it necessary to adopt more aggressive reuse factors such as reuse 2 and reuse 1 in which each beam can make use of the entire bandwidth B. Under such deployments, users at the edge of the co-channel cells experience severe CCI which adversely affects their data rate and quality of service.

The CCI mitigation techniques applied at the satellite gateway such as precoding and beamforming are well known. The effectiveness of precoding and beamforming depends on the accuracy of the Channel State Information (CSI) (for example, magnitude, phase, and delay) available at the gateway. CSI depends on effective estimation and frequent reporting from user terminals to the gateway. Furthermore, transmitter-based techniques used, for example, at the gateway, are also limited by the feeder-link bandwidth since effective precoding requires that signals transmitted to co-frequency beams come from the same gateway.

The multiuser detection framework of prior art receivers assumes that CCI is memoryless, namely, that the current receive filter sampled output depends only on the current symbol from CCI. However, memory effects in CCI are inevitable since the desired signal and interfering signals arrive asynchronously at the user terminal. Even though the co-channel beams may be formed and emitted by the satellite simultaneously, they propagate through different paths causing unavoidable differential delays. Further, the beams could be conveying signals originating from multiple gateways, interconnected via terrestrial links. Other sources that generate memory effects include different symbol rates required by co-channel beams and/or using pulse shaping with different rolloff values. Prior art receivers based on optimal realizations handle memory effects with a complexity that is exponential with the number of interferers and the memory span of each CCI source, making such a receiver severely unaffordable. Other receivers suffer from 2 dB of degradation with only moderate timing offset of 15% of the symbol period. Additionally, the memory effects can be made worse due to different symbol rates and/or different roll-off factors employed by the different co-channel beams. These critical limitations motivate the development of low-complexity, innovative solutions that can compensate for CCI with memory at the user terminal and are described in detail in this disclosure.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In the present teachings, receiver based CCI mitigation alleviates the need for frequent reporting of CSI by the user terminal to the different gateways. Additionally, the receiver-based mitigation overcomes feeder-link bandwidth limitation since it does not require the interfering signals being processed at the user terminal to be generated by the same gateway.

The present teachings disclose several signal processing innovations absent in the prior art multiuser detection techniques. An innovation is the ability to mitigate memory effects in CCI at a user terminal receiver, having a modular structure, without an exponential increase in the receiver complexity. The receiver mitigates interference terms with computational power commensurate with the intensity level of interference experienced at the user terminal. Extensive performance evaluation of the receiver using state-of-the art MODCODs selected from the DVB-S2X standard demonstrates effectiveness under severe CCI with memory. The performance associated with the receiver is near capacity approaching the limits predicted by information theory.

A system of one or more computers can be configured to perform particular operations or actions by virtue of having software, firmware, hardware, or a combination of them installed on the system that in operation causes or cause the system to perform the actions. One or more computer programs can be configured to perform operations or actions by virtue of including instructions that, when executed by data processing apparatus, cause the apparatus to perform the actions. One general aspect of a communications apparatus includes processing a composite signal may include a desired signal and interferer signals, where the desired signal may include desired symbols and the interferer signals may include interferer symbols; and N frameworks, each framework may include a detector to partition the desired symbols and the interferer symbols based on an interference severity into a dominant group and a non-dominant group, and to generate A Posteriori Probabilities (APP) of the desired symbols and the interferer symbols. The detector of each of the N frameworks generates the APP based on a feedback of a priori probabilities from each of the N frameworks. Other embodiments of this aspect include corresponding computer systems, apparatus, and computer programs recorded on one or more computer storage devices, each configured to perform the actions of the methods.

Implementations may include one or more of the following features. The communications apparatus where the detector of each of the N frameworks transforms the APP to a First Log-Likelihood Ratios (LLRs) using a bit-to-symbol mapping rule, and each of N frameworks further may include a deinterleaver to deinterleave the first LLRs into a decoder input, a Forward Error Correcting (FEC) decoder to decode the decoder input and to generate a second LLRs from a decoded decoder input, and an interleaver to interleave the second LLRs, where the second LLR are treated as a priori probabilities for a respective N framework after the interleaver of the respective N framework, and the second LLRs of each of the N frameworks represent either the desired symbols or the interferer symbols.

In some embodiments, the desired signal is more robust than each of the interferer signals, and the second LLRs from the FEC decoder of a first framework of the N frameworks represent the desired symbols. In some embodiments, at least one of the interferer signals is more robust than the desired signal, and the second LLRs from the FEC decoder of a framework other than a first framework of the N frameworks represent the desired symbols. In some embodiments, the desired symbols are recovered by Simultaneous Decoding (SD) or by Simultaneous Non-Unique Decoding (SND). In some embodiments, the detector is selected from a Soft-In Soft-Out (SISO) detector, a Divide-And-Conquer (DAC) detector or a SISO DAC detector. In some embodiments, the communications apparatus is disposed in an SISO Iterative Divide and Conquer (IDAC) receiver and the detector is a SISO DAC detector. In some embodiments, the dominant group may include an Optimal-Bayesian (OB) group via a probability mass function (pmf). The non-dominant group may include a Noise-Floor (NF) group incorporated via a power of each member and a Subtractive-Cancellation (SC) group incorporated via first- and second-order moments derived from the a priori probabilities, and the dominant group may include an Optimal-Bayesian (OB) group incorporated via a probability mass function (pmf).

In some embodiments, an output $$x[k] = |\gamma_{n_d}| \cdot a_{n_d,k}$$
$$+ \underline{h}_{I,n_d}^{(OB)}[k] \cdot \underline{a}_{I,n_d}^{(OB)}[k] + \underline{h}_{I,n_d}^{(SC)}[k] \cdot \underline{a}_{I,n_d}^{(SC)}[k]$$
$$+ \underline{h}_{I,n_d}^{(NF)}[k] \cdot \underline{a}_{I,n_d}^{(NF)}[k] + n[k],$$

where $a_{I,n_d}[k]$ is partitioned into three groups, $\underline{a}_{I,n_d}^{(NF)}[k]$, $\underline{a}_{I,n_d}^{(SC)}[k]$, $\underline{a}_{I,n_d}^{(OB)}[k]$, and $\underline{h}_{I,n_d}^{(NF)}[k]$, $\underline{h}_{I,n_d}^{(SC)}[k]$, $\underline{h}_{I,n_d}^{(OB)}[k]$ represents spatial and temporal CCI channel coefficients corresponding to the NF group, the SC group and the OB group, respectively. In some embodiments, the detector is mathematically expressed as $$P_{DAC}(a_{n_d,k} | x[k]) = \sum_{\underline{a}_{I,n_d}^{(OB)}[k]} p_{DAC}(x[k] | a_{n_d,k}, \underline{a}_{I,n_d}^{(OB)}[k], \underline{a}_{I,n_d}^{(SC)}[k], \underline{a}_{I,n_d}^{(NF)}[k]) \cdot$$
$$P(\underline{a}_{I,n_d}^{(OB)}[k]) \cdot P(a_{n_d,k}),$$

where $p_{DAC}(\cdot)$ is $$p_{DAC}(x[k] | a_{n_d,k}, \underline{a}_{I,n_d}^{(OB)}[k], \underline{a}_{I,n_d}^{(SC)}[k], \underline{a}_{I,n_d}^{(NF)} | [k]) =$$
$$\exp\left\{-\frac{\left|(x[k] - \hat{I}_{n_d}^{(SC)}[k]) - |\gamma_{n_d}| \cdot a_{n_d,k} - \underline{h}_{I,n_d}^{(OB)}[k] \cdot \underline{a}_{I,n_d}^{(OB)}[k]\right|^2}{\sigma_n^2 + c_{I,n_d}^{(SC)}[k] + c_{I,n_d}^{(NF)}[k]}\right\}$$

a likelihood function associated with observing x[k], P(•) is the a priori probabilities corresponding to the second LLRs representing the desired symbols, $\hat{I}_{n_d}^{(SC)}[k] = \underline{h}_{I,n_d}^{(SC)}[k] \cdot \mathbb{E}\{\underline{a}_{I,n_d}^{(SC)}[k]\}$, $c_{I,n_d}^{(SC)}[k] \cdot \text{Cov}\{\underline{a}_{I,n_d}^{(SC)}[k]\} \cdot (\underline{h}_{I,n_d}^{(SC)}[k])^H$, and $c_{I,n_d}^{(NF)}[k] = \underline{h}_{I,n_d}^{(NF)}[k] \cdot (\underline{h}_{I,n_d}^{(NF)}[k])^H$. In some embodiments, a count of the N frameworks is selected from one (1), two (2) or three (3). In some embodiments, the desired signal and the interferer signals may include DVB-S2X standard compliant signals. Implementations of the described techniques may include hardware, a method or process, or computer software on a computer-accessible medium.

One general aspect includes a computer implemented method. The method includes providing a composite signal may include a desired signal and interferer signals, where the desired signal may include desired symbols and the interferer signals may include interferer symbols; and iteratively computing, N frameworks, each framework may include partitioning the desired symbols and the interferer symbols based on an interference severity into a dominant group and a non-dominant group, and generating a posteriori probabilities (APP) of the desired symbols and the interferer symbols. The method also includes where the detector of each of the N frameworks generates the APP based on a feedback of a priori probabilities from each of the N frameworks. Other embodiments of this aspect include corresponding computer systems, apparatus, and computer programs recorded on one or more computer storage devices, each configured to perform the actions of the methods.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The present teachings may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

The ever-increasing demand for higher throughput and ubiquitous connectivity implies extracting higher spectral efficiencies and improved energy efficiencies from modern satellite broadband systems. Spectrum scarcity imposes fundamental limitations on the data rates and necessitates the most efficient use of available frequency resources.

In the prior art, precoding and beamforming techniques are limited by the accuracy of Channel State Information (CSI) available at the gateway. Additionally, precoding techniques are also limited by the lack of feeder-link bandwidth. Compensating for CCI at a receiver, for example, a user terminal, overcomes the above limitations. In the present teachings, a user terminal mitigates CCI in a multiuser detection framework by jointly processing a desired signal together with a dominant source. In some embodiments, the dominant source can comprise one, two or more interferers.

Extensive computer simulations, along with accompanying information-theoretic results, demonstrate the superlative performance of the present teachings when tackling severe cases of CCI in multibeam satellite systems employing aggressive frequency reuse, even without imposing the restrictive requirement of synchronous reception.

System Model

Figure 2:
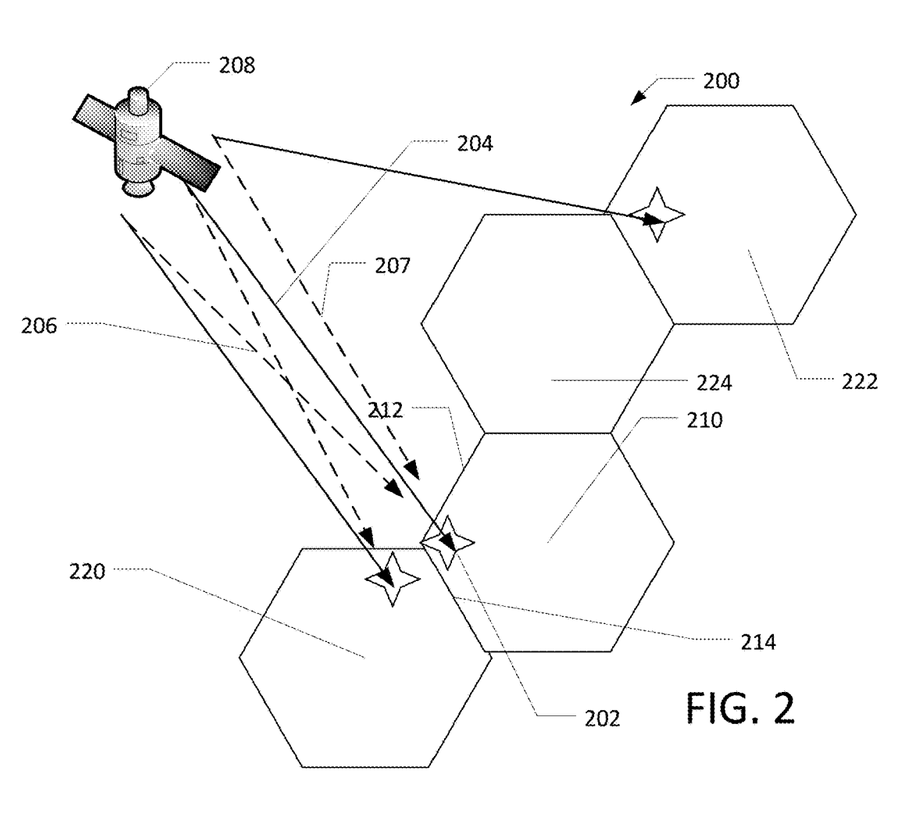
FIG. 2 illustrates two users serviced by two co-channel beams showing CCI between beams according to various embodiments.

FIG. 2 illustrates two users serviced by two co-channel beams showing CCI between beams according to various embodiments.

FIG. 2 illustrates a satellite communications system 200 including a user terminal (UT) 202 communicating with a satellite 208 via a beam 204. When the UT 202 is located near an edge 212 or 214 of their coverage area 210, a co-channel beam 206 (here intended for coverage area 220), in a reuse 2 deployment will interfere with the beam 204. In this case, the UT 202 will receive its desired/intended signal (beam 204) in the presence of interference arising from interferer signals/co-channel beams 206, 207 intended for a UT disposed in the coverage areas 220, 222 respectively. The ratio of the beam 204 at UT 202 (C) to the interfering signal/co-channel beams 206, 207 (I) is known as the carrier-to-interference ratio (C/I) and can be as high as 0 dB, or of equal strength. In some deployments, one or more of the interferer signals 206, 207 may be more robust than the desired signal 204. An interference severity may be based on the C/I ratio.

It is quite likely that the desired signal and the interferer signals can come from different gateways (not shown), employ different coded-modulation (MODCOD) formats, have different symbol rates and pulse shaping filters with different roll-off factors. The desired and interfering signals can arrive at the user terminal in an asynchronous manner. Even though the co-channel beams may be formed and emitted by the satellite simultaneously, they propagate through different paths causing unavoidable differential delays. Further, the beams could be conveying signals originating from multiple gateways, interconnected via terrestrial links. Other sources that generate memory effects include different symbol rates required by co-channel beams and/or using pulse shaping with different rolloff values. CCI mitigation techniques are required to maintain reasonable performance for such users.

Here co-channel beam 206 may also be known as a dominant source. When a UT, such as UT 202, is disposed near two edges of its coverage area (i.e., coverage area 210), the UT 202 may receive two co-channel beams (second co-channel beam not shown) and portions of both may qualify as dominant sources with respect to the desired signal. For example, a current sample of the co-channel beam may be considered a dominant source, while a previous sample of the co-channel beam may be considered a non-dominant source. In some embodiments, an intended signal of a UT may be interfered with by one or more dominant sources.

The interfering signal/co-channel beams 206, 207 may include interfering symbols. Interfering symbols of the beam 206 targeting the coverage area 220 immediately adjacent to the coverage area 210 where the UT 202 is disposed may be partitioned into a dominant group of interfering symbols. Interfering symbols of the beam 207 targeting the coverage area 222 not immediately adjacent to the coverage area 210 may be partitioned into a non-dominant group of interfering symbols. Interfering symbols of a beam (not shown) targeting the coverage area 224 that is immediately adjacent to the coverage area 210 may also be partitioned into the non-dominant group of interfering symbols as the UT 202 is not disposed adjacent to a common edge of the coverage areas 210, 225.

System Model

Figure 3:
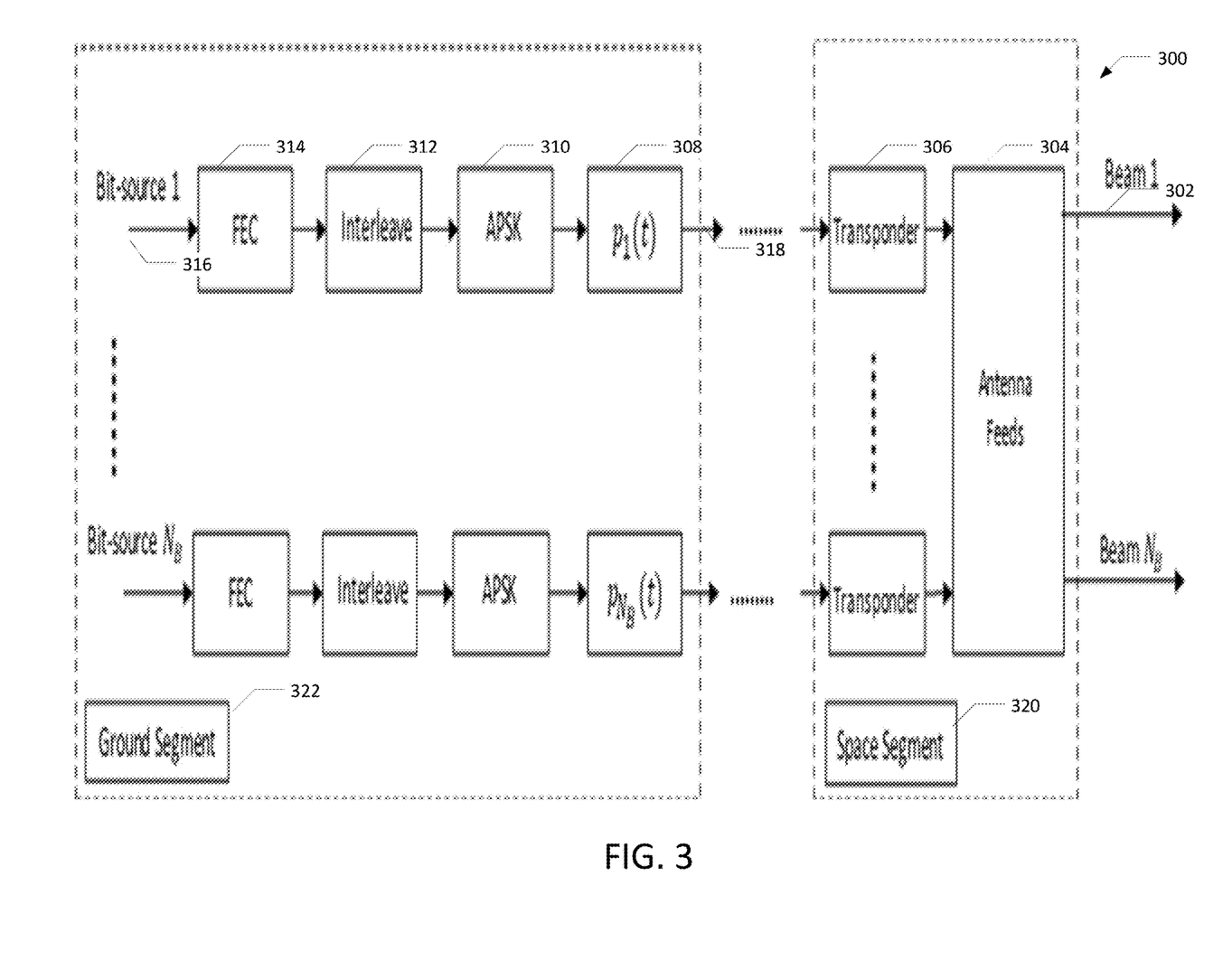
FIG. 3 illustrates a multi-spot beam satellite system model according to various embodiments.

FIG. 3 illustrates a multi-spot beam satellite system model according to various embodiments.

A multi-spot beam satellite system 300 is illustrated in FIG. 3. FIG. 3 focuses on a forward link from a satellite gateway to a user terminal. Information bits 316 intended for a particular user located in a specific beam n, are FEC-encoded 314, bit-interleaved 312 and mapped onto an M-ary complex constellation 310 at a gateway 322 to form a symbol sequence of length Ns and symbol rate $T_{s,n}^{-1}$ such that, $\{a_{n,i}; i=0, 1, \ldots, Ns-1\}$. The uplink signal after pulse shaping has a baseband representation given by $$s_n(t) = \sum_{i=0}^{N_s-1} a_{n,i} \cdot p_n(t - iT_{s,n}). \quad (1)$$

Uplink signals 318 intended for the different spot beams are processed by their respective transponders 306 and transmitted to intended beams 302 by the satellite feed and antenna mechanism 320.

When aggressive frequency reuse factors, such as reuse 1 and reuse 2 are employed to boost a system's capacity, user terminals, especially those at the beam edge, experience a high level of CCI due to the sharing of common time-frequency resources. In such cases, the terminal receives the intended transmission and transmissions from $N_B-1$ co-channel beams such that the received signal at a user terminal can be modelled using (1) as $$r(t) = \sum_{n=1}^{N_B} \sum_i \gamma_n \cdot a_{n,i} \cdot p_n(t - (i + \epsilon_n)T_{s,n}) \cdot e^{j(2\pi\delta_{f_n} t + \theta_n)} + n(t) \quad (2)$$

In (2), $\gamma_n$ is a complex-valued channel gain that is a function of the antenna gain from the nth beam's feed in the direction of the user terminal under consideration. Here, $\{\epsilon_n, \delta_{f_n}, \theta_n\}$ represents the normalized differences in arrival times, carrier frequencies and carrier phases between the $N_B$ co-frequency beams at the receiver. In this example, downlink noise n(t) is assumed as an Additive White Gaussian Noise (AWGN) with a single-sided Power Spectral Density (PSD) level of $N_0$ (Watt/Hz). The uplink noise may be assumed to be negligible relative to the downlink noise, a situation achieved through proper satellite link parameters including the size of the transmit antenna. Finally, it is assumed that any on-board High-Power Amplifiers (HPAs) have small nonlinear impact at the user terminals.

Analytical Characterization of CCI

Without limitation, per statistical decision theory, a set of sufficient statistics can be generated at the output of a filter matched to the desired signal, labelled as $n_d$, then sampled at the symbol rate $T_{s,nd}$, or $x((k+\epsilon_{nd}) T_{s,nd})$, where $$x(t) = \int_{-\infty}^{\infty} e^{-j\phi\gamma_{n_d}} \cdot r(\alpha) \cdot e^{-j(2\pi\delta_{f_{n_d}}\alpha + \theta_{n_d})} \cdot p_{n_d}^*(\alpha - t)d\alpha \quad (3)$$

and $\phi_{\gamma_{n_d}}$ is the phase associated with the complex-valued channel gain $\gamma_{n_d}$. To characterize the effective CCI channel response, substitute (2) into (3) to yield $$x(t) = \sum_{n=1}^{N_B} \sum_{i=-\infty}^{\infty} e^{-j\phi\gamma_{n_d}} \cdot \gamma_n \cdot a_{n,i} \cdot \eta_{n,n_d}((i+\epsilon_n)T_{s,n}, t) + n(t) \quad (4)$$

where $e^{-j\phi\gamma_{n_d}} \cdot \gamma_n$ is the spatial contribution, while $\eta_{n,n_d}(t_1,t_2)$ represents the time-varying impulse response due to the temporal contribution of CCI. In (4), $$\eta_{n,n_d}(t_1, t_2) = e^{-j\left(2\pi\left(\delta_{f_{n_d}} - \delta_{f_n}\right)t_2 + \left(\theta_{n_d} - \theta_n\right)\right)} \cdot \Gamma_{n,n_d}(t_2 - t_1; \delta_{f_{n_d}} - \delta_{f_n}) \quad (5)$$

and $$\Gamma_{n,n_d}(\delta_t; \delta_f) = \int_{-\infty}^{\infty} p_{n_d}^*(\alpha) \cdot p_n(\alpha + \delta_t) \cdot e^{-j2\pi\delta_f \alpha} d\alpha \quad (6)$$

Focusing on the pulse shaping that satisfies the Nyquist criterion of zero Inter-Symbol Interference (ISI), such as bandwidth-efficient Root-Raised Cosine (RRC) pulses, used in the widely adopted DVB-S2X satellite standard. Thus, sampling the matched filter output in (4) at the correct sampling instant yields $$x((k + \epsilon_{n_d})T_{s,n_d}) \quad (7)$$

$$= |\gamma_{n_d}|a_{n_d,k}$$

$$+ \sum_{\substack{n=1 \\ n \neq n_d}}^{N_B} \sum_{l=-L_n}^{L_n} e^{-j\phi\gamma_{n_d}} \cdot \gamma_\eta \cdot a_{n,k-l} \cdot \eta_{n,n_d}((k-l+\epsilon_n)T_{s,n}, (k+\epsilon_{n_d})T_{s,n_d})$$

$$+ n((k + \epsilon_{n_d})T_{s,n_d})$$

where $L_n$ denotes the memory-span associated with CCI. From (7), it can be inferred that the desired symbols at the matched filter output are affected by CCI coming from $N_B-1$ beams, in addition to Gaussian noise. It can also be inferred that CCI has memory due to the interfering signals combining asynchronously. The memory effects can be made worse due to different symbol rates and/or different roll-off factors employed by the different co-channel beams.

Iterative Divide-and-Conquer Detection

Iterative Soft-in-Soft-Out Receiver

Figure 4:
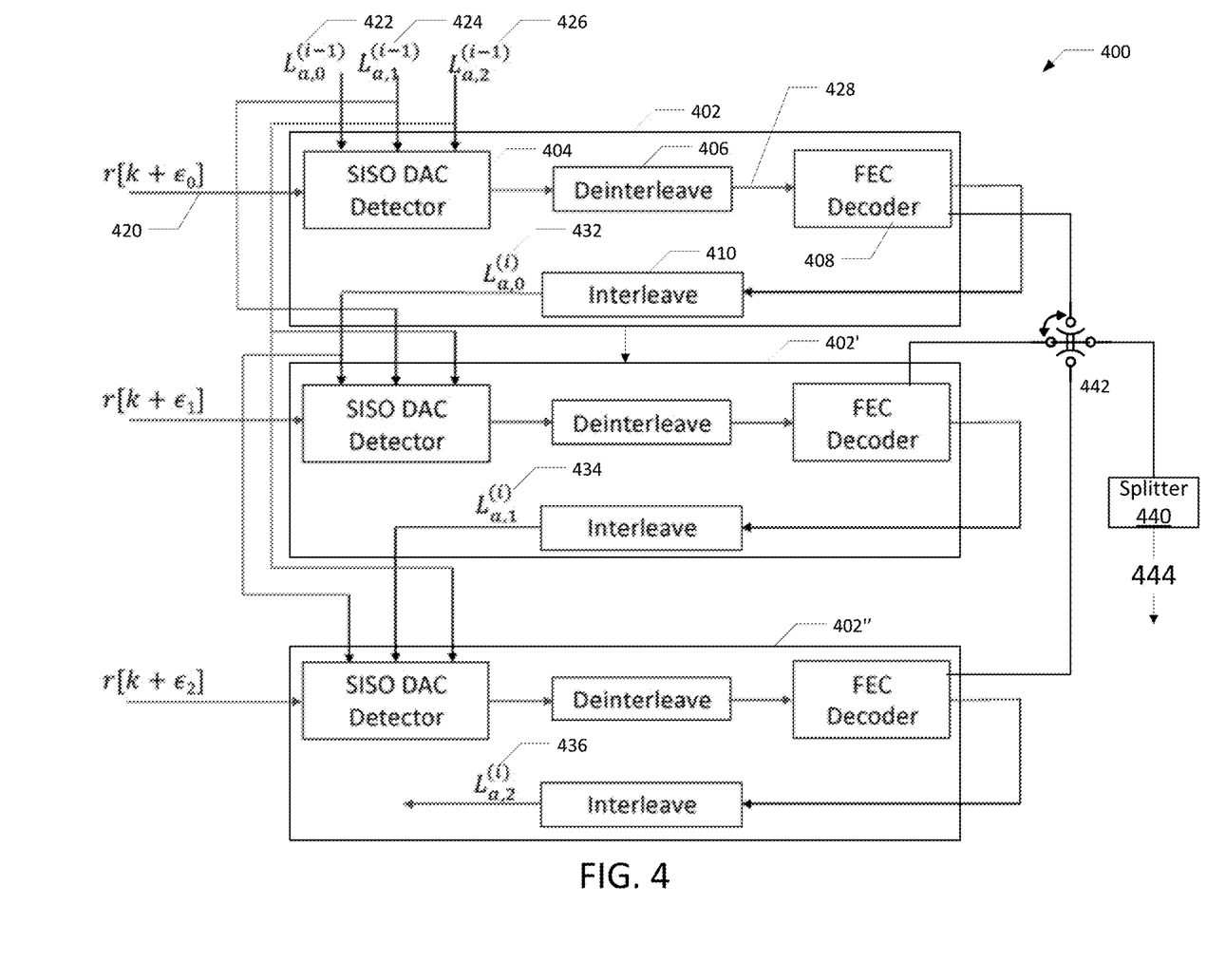
FIG. 4 illustrates a block diagram of a soft-in-soft-out (SISO) IDAC receiver according to various embodiments, shown here for two dominant interferers.

FIG. 4 illustrates a block diagram of a Soft-In-Soft-Out (SISO) Iterative Soft-In-Soft-Out (IDAC) receiver according to various embodiments.

A Soft-In-Soft-Out (SISO) Iterative Soft-In-Soft-Out (IDAC) receiver 400 implements a plurality of Soft-In-Soft-Out (SISO) frameworks 402, 402' and 402". The count of SISO frameworks may vary. For brevity, the framework 402 is further elaborated below. However, each of the frameworks 402', 402" function in a manner similar to the framework 402.

The framework 402 performs joint detection with a SISO DAC detector 404 along with decoding with a FEC decoder 408 (after deinterleaving with a deinterleaver 406) is applied in an iterative fashion to recover the information bits intended for a user terminal. An outer or global iteration begins by processing a composite signal 420 including a desired signal and interfering signal. The outer or global iteration processes the interfering signal by employing the most robust signal in the joint CCI SISO DAC detector 404, while assuming equally likely a priori information 422, 424, 426 for the interferer signal, the desired signal and any additional interfering signal being processed jointly. The Iterative Divide-And-Conquer Detection (IDAC), detailed above, provides soft-information about CCI in the form of the symbol A Posteriori Probabilities (APPS) 432, 434, 436 which are transformed to bit Log-Likelihood Ratios (LLRs) using the bit-to-symbol mapping rule employed at the transmitter.

These bit LLRs are in turn deinterleaved by the deinterleaver 406 and input to the FEC decoder 408 as a decoding input 428. The FEC decoder 408 subsequently generates LLR soft-estimates of the interfering signal's information bits. These are converted to extrinsic information by subtracting the LLRs at the input to the FEC decoder 408. The receiver 400 immediately uses this extrinsic information as a posteriori probability 432, 434, 436 for processing the composite signal 420 employing the next most robust signal, thereby incorporating the latest information from the previous signal's FEC decoder, during the same outer iteration, leading to faster convergence.

At the completion of an outer iteration, the receiver has the APP 432, 434, 436 estimates for all the signals being jointly processed and can use them during the next outer iteration as a priori information 422, 424, 426. As such the APP of a first iteration is the a priori information for the next iteration. Each framework may use the APP in succession or in parallel. For example, the receiver 400 uses the APP generated by the framework 402 in succession for the framework 402', and the APP generated by the framework 402' is used in succession for the framework 402". In a parallel implementation (not shown) of the receiver, the APP of an iteration is not used by the plurality of frameworks within the iteration.

The above framework can be applied to systems employing either Simultaneous Decoding (SD) or Simultaneous Non-unique Decoding (SND) methods. In SD, after a certain maximum number of global iterations, the hard decisions provided by two or more decoders is multiplexed by multiplexor 442 to form an estimate of the desired symbols 444 that may be converted to the user's information bits, for example, in a splitter 440. In SND, after a certain maximum number of global iterations, the hard decisions provided by only a single FEC decoder provides an estimate of the desired symbols 444 that may be converted to the user's information bits, for example, in the splitter 440. In SND, the multiplexor 442 may be eliminated.

Stacked Construction of CCI with Memory

Using the analysis above, a useful formulation is disclosed for IDAC detection. It is based on a stacked construction that models the spatial and temporal contributions of the CCI in multibeam satellite systems on the forward link, namely from the gateway to the user terminals. The kth time-instant of the MF output x[k] of (7), received in the $n_d$th beam, is described as $$x[k] = |\gamma_{n_d}| \cdot a_{n_d,k} + \underline{h}_{I,n_d}[k] \cdot \underline{a}_{I,n_d}[k] + n[k] \quad (8)$$

where $h_{I,n_d}[k]$ is a stacked row-vector containing the channel coefficients associated with each of the neighboring co-channel interfering beams and $a_{I,n_d}[k]$ is a stacked column-vector that models the corresponding symbols serviced by the interfering beams, defined as $$\underline{h}_{I,n_d}[k] = [\underline{h}_1[k;L_1], \ldots \underline{h}_{n_d-1}[k;L_{n_d+1}], \underline{h}_{n_d+1}[k;L_{n_d+1}], \ldots \underline{h}_{N_B}[k;L_{N_B}]] \quad (9)$$

and $$\underline{a}_{I,n_d}[k] = \begin{bmatrix} \underline{a}_1[k;L_1] \\ \vdots \\ \underline{a}_{n_d-1}[k;L_{n_d-1}] \\ \underline{a}_{n_d+1}[k;L_{n_d+1}] \\ \vdots \\ \underline{a}_{N_B}[k;L_{N_B}] \end{bmatrix}. \quad (10)$$

respectively. The individual row-vector $h_{i,n}[k]$ in (9) is in turn composed of a vector containing the spatial and temporal coefficients belonging to the nth beam with single-sided memory of $L_n$ (see for example, 432, 434, 436 in FIG. 4) symbols, outlined in (7), and expressed as $$\underline{h}_n[k;L_n] = e^{-j\phi_{\gamma_n}} \cdot \gamma_n \cdot \begin{bmatrix} \eta_{n,n_d}((k+L_n+\epsilon_n)T_{s,n},(k+\epsilon_{n_d})T_{s,n_d}) \\ \eta_{n,n_d}((k+L_n-1+\epsilon_n)T_{s,n},(k+\epsilon_{n_d})T_{s,n_d}) \\ \vdots \\ \eta_{n,n_d}((k-L_n+\epsilon_n)T_{s,n},(k+\epsilon_{n_d})T_{s,n_d}) \end{bmatrix} \quad (11)$$

In (10), $a_n[k, L_n]$ is a column-vector containing the individual interfering symbols from the nth beam or $$\underline{a}_n[k;L_n] = \begin{bmatrix} a_{n,k-L_n} \\ a_{n,k-L_n+1} \\ \vdots \\ a_{n,k+L_n} \end{bmatrix} \quad (12)$$

SISO Divide-And-Conquer Detector

The receiver implements a SISO Divide-And-Conquer (DAC) detector of CCI which partitions the interfering symbols into three smaller groups depending on the intensity of their interference levels. These smaller groups use different methods of contributing to the APP computation. The first is the Noise-Floor (NF) group whose elements are incorporated only through their powers. The second is the Subtractive-Cancellation (SC) group which is incorporated in the SISO DAC APP module via first- and second-order moments, derived from a priori probabilities.

The third group is based on the Optimal-Bayesian (OB) method contributing to the SISO DAC APP module using the a priori probability mass function (pmf) of the interfering symbols from within the OB group only. To start the kth time-instant of the MF output x[k] of (8) is equivalently expressed as $$x[k] = |\gamma_{n_d}| \cdot a_{n_d,k} \quad (13)$$
$$+ \underline{h}_{I,n_d}^{(OB)}[k] \cdot \underline{a}_{I,n_d}^{(OB)}[k] + \underline{h}_{I,n_d}^{(SC)}[k] \cdot \underline{a}_{I,n_d}^{(SC)}[k]$$
$$+ \underline{h}_{I,n_d}^{(NF)}[k] \cdot \underline{a}_{I,n_d}^{(NF)}[k] + n[k]$$

where the elements of $\underline{a}_{I,n_d}[k]$ is partitioned into three groups, $\underline{a}_{I,n_d}^{(NF)}[k]$, $\underline{a}_{I,n_d}^{(SC)}[k]$, $\underline{a}_{I,n_d}^{(OB)}[k]$, and $\underline{h}_{I,n_d}^{(NF)}[k]$, $\underline{h}_{I,n_d}^{(SC)}[k]$, $\underline{h}_{I,n_d}^{(OB)}[k]$ are the corresponding spatial and temporal CCI channel coefficients extracted from $\underline{h}_{I,n_d}[k]$. Based on the partitioned expression (13), the proposed SISO DAC APP module, $P_{DAC}(a_{n_d,k}|x[k])$, is mathematically expressed as $$P_{DAC}(a_{n_d,k}|x[k]) = \qquad (14)$$
$$\sum_{\underline{a}_{I,n_d}^{(OB)}[k]} p_{DAC}(x[k]|a_{n_d,k}, \underline{a}_{I,n_d}^{(OB)}[k], \underline{a}_{I,n_d}^{(SC)}[k], \underline{a}_{I,n_d}^{(NF)}[k]) \cdot$$
$$P(\underline{a}_{I,n_d}^{(OB)}[k]) \cdot P(a_{n_d,k}),$$

where $p_{DAC}(\cdot)$ is the likelihood function associated with observing $x[k]$ given the desired and interfering symbols and $P(\cdot)$ is the a priori pmf corresponding to the symbols computed based on the individual FEC decoders. In (14), the likelihood function $p_{DAC}(\cdot)$ assumes that $x[k]$ is a random variable that retains a Gaussian density expression or $$p_{DAC}(x[k]|a_{n_d,k}, \underline{a}_{I,n_d}^{(OB)}[k], \underline{a}_{I,n_d}^{(SC)}[k], \underline{a}_{I,n_d}^{(NF)}[k]) = \qquad (15)$$
$$\exp\left\{-\frac{|(x[k]-\hat{I}_{n_d}^{(SC)}[k])-|\gamma_{n_d}|\cdot a_{n_d,k}-\underline{h}_{I,n_d}^{(OB)}[k]\cdot\underline{a}_{I,n_d}^{(OB)}[k]|^2}{\sigma_n^2+c_{I,n_d}^{(SC)}[k]+c_{I,n_d}^{(NF)}[k]}\right\}$$

where $\hat{I}_{n_d}^{(SC)}[k]$ is the soft CCI estimate arising from the SC group that is subtracted and is computed as $$\hat{I}_{n_d}^{(SC)}[k]=\underline{h}_{I,n_d}^{(SC)}[k]\cdot\mathbb{E}\{\underline{a}_{I,n_d}^{(SC)}[k]\} \qquad (16)$$

Also, the likelihood expression in (15) contains the variances from the SC and NF interfering groups, $c_{I,n_d}^{(SC)}[k]$ and $c_{I,n_d}^{(NF)}[k]$, respectively, obtained by $$c_{I,n_d}^{(SC)}[k]=\underline{h}_{I,n_d}^{(SC)}[k]\cdot\mathbb{C}\mathrm{ov}\{\underline{a}_{I,n_d}^{(SC)}[k]\}\cdot(\underline{h}_{I,n_d}^{(SC)}[k])^H \qquad (17)$$

and $$c_{I,n_d}^{(NF)}[k]=\underline{h}_{I,n_d}^{(NF)}[k]\cdot(\underline{h}_{I,n_d}^{(NF)}[k])^H \qquad (18)$$

Performance Evaluation

Extensive performance evaluations demonstrate the effectiveness of the IDAC receiver. The simulation setup implements the system model described previously and employs Low-Density Parity Check (LDPC) codes for FEC as well as the modulation formats defined in the DVB-S2X standard. RRC filters with a rolloff of 0.05 are considered at the transmitters for pulse-shaping and at their corresponding receivers for matched filtering. It is assumed that the satellite transponders are operated in a single-carrier per-HPA mode with the operating point causing small nonlinear distortion at the user terminals. It is also assumed that a multibeam system is employing aggressive frequency reuse, and as such the channel gains from a particular beam in the direction of a user terminal located in a neighboring co-channel beam are severe. This results in CCI at the user terminal which can be as high as C/I=0 dB, i.e., of equal strength, as considered in the performance evaluations. In a multibeam system, a user's receiver may experience a substantial amount of CCI with memory due to the desired signal and interference arriving at the user terminal asynchronously with some relative delay.

Figure 5:
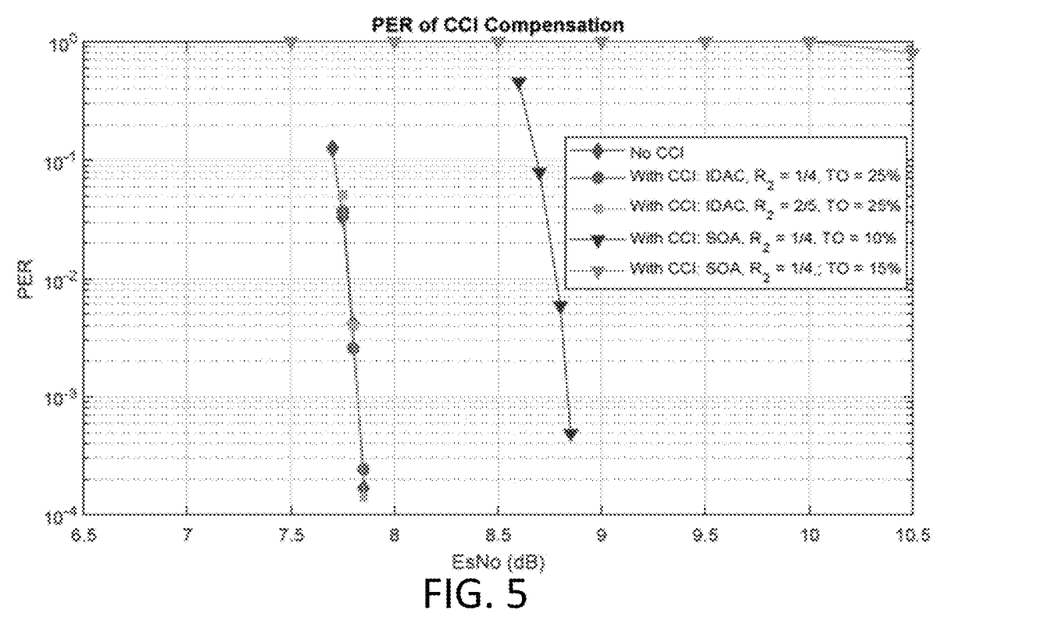
FIG. 5 illustrates a coded PER of DVB-S2X 16APSK with code rate 28/45 when interfered by QPSK with rate $R_2$ at different levels of timing offset (TO), according to various embodiments.

FIG. 5 illustrates a coded PER of DVB-S2X 16APSK with code rate 28/45 when interfered by QPSK with rate $R_2$ at different levels of timing offset (TO) according to various embodiments.

FIG. 5 starts with an examination of the Packet Error Rate (PER) performance in the presence of CCI and AWGN. FIG. 5 documents PER versus $E_S/N_0$ for a desired user employing 16APSK with the rate 28/45 LDPC code. In this scenario, 16APSK symbols intended for the desired user arrive at the user terminal in the presence of a strong co-channel interferer at C/I=0 dB that employs QPSK MODCOD with rates of 1/4 or 2/5. A significant amount of distortion experienced at the decoder input will cause the LDPC decoding to fail without CCI mitigation. FIG. 5 also illustrates the inability of state-of-the-art (SOA) memoryless CCI mitigation techniques popular in the literature to handle asynchronous reception. As an example, when the offset between the desired signal and the interferer is 10% of $T_S$, performance with the memoryless solution degrades by more than 1 dB and a delay of 15% relative to $T_S$ causes the receiver to become ineffective. These limitations motivate the need for the innovative, low-complexity and modular IDAC framework disclosed in the present teachings.

As is evident in FIG. 5, the receiver of the present teachings does not suffer from performance degradation even at delays as high as 25% of Ts and approaches no-CCI performance. Further, the present teachings are just as effective when the interfering beam carries QPSK with the weaker code rate of 2/5. The low-complexity of the present teachings is particularly noteworthy in light of the significant CCI memory span and APSK modulation cardinality. The impressive performance offered by the present teachings allows user terminals located at the edges of co-frequency beams to benefit from high spectral efficiencies offered by APSK MODCODs.

Figure 6:
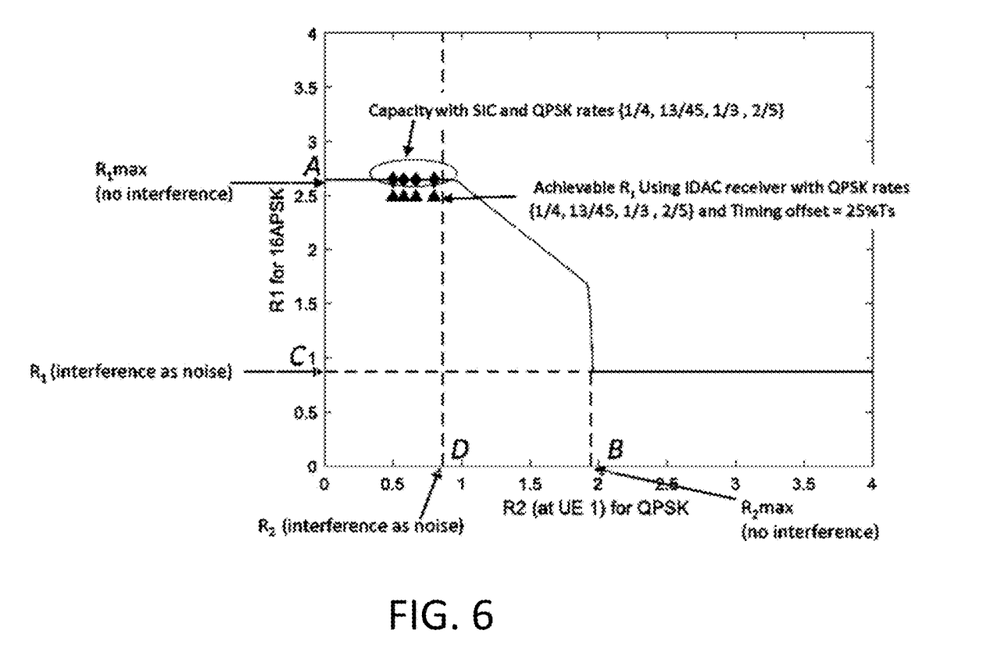
FIG. 6 illustrates an information-theoretic achievable-rate region for 16APSK when interfered by QPSK at C/I=0 dB and $E_S/N_0$=7.83 dB), according to various embodiments.

FIG. 6 illustrates an information-theoretic achievable-rate region for 16APSK when interfered by QPSK at C/I=0 dB and $E_S/N_0$=7.83 dB), according to various embodiments.

FIG. 6 illustrates a map out of the information-theoretic rate regions supported at a user terminal when 16APSK and QPSK symbols are transmitted on co-channel beams. These report mutual information between the transmitted modulated symbols and the received symbols at $E_S/N_0$=7.83 dB. By adopting that with the SND method, only 16APSK symbols carry information for the targeted user which the user terminal can recover by jointly processing the desired signal and the interfering signal. The rate region has several points of interest that are discussed here; the point labelled A denotes the maximum rate $R_1$ at which 16APSK symbols can be reliably received at the user terminal when there is no CCI and is approximately 2.65 bits-per-symbol.

Conversely, the point B denotes the maximum rate $R_2$ at which QPSK symbols can be reliably received at the same user terminal, without any CCI and is 1.95 bits-per-symbol. Points C and D are the maximum rates possible when CCI is unmitigated and treated as noise at the receiver, these rates are $R_1$=0.87 bits-per-symbol for 16APSK and $R_2$=0.86 bits-per-symbol for QPSK, respectively. It is clear from these results that CCI, if left unmitigated can impose a significant penalty on the spectral efficiency. Information theory also indicates that as long as $0<R_2\leq0.86$, it is possible to receive 16APSK at its maximum rate at the user terminal in the presence of CCI by jointly processing both signals. In particular, QPSK can be recovered first and can subsequently assist in recovering the 16APSK symbols. As an example, the curve marked in green diamond indicates that 16APSK can be signaled at its maximum rate of 2.65 bits-per-symbol when the interfering QPSK signal has rates $R_2=2\times\{1/4, 13/45, 1/3, 2/5\}$ by jointly processing both signals at the user terminal.

It is also interesting to visualize how the rates promised by information-theory compare with performance achievable with the IDAC receiver employing finite-length DVB-S2X LDPC codes and operating under the realistic assumption of CCI with memory. Towards this end, extensive PER performance simulations were conducted by transmitting progressively more spectrally efficient QPSK MODCODs on the interfering signal by increasing its code rate to 13/45, 1/3 and 2/5. As done previously, C/I=0 dB and timing offset of 25% of Ts were assumed. Results indicate that, similar to FIG. 5, there is no noticeable performance loss relative to a no-CCI scenario. This implies that the IDAC receiver does not penalize the interfering user to employ its most spectrally efficient MODCOD. Furthermore, the achievable rate for 16APSK of 2.5 bits-per-symbol, when using 28/45 code, is quite close to the information-theoretic maximum of 2.65 bits-per-symbol. This is also illustrated in FIG. 6, where the $E_S/N_0$ for the coded simulations corresponds to a PER of $10^{-3}$. Hence, it is easy to infer from these results that the IDAC receiver offers a capacity-approaching solution to handling severe CCI at the user terminal, even when confronted with symbol asynchronism.

Having described preferred embodiments of a system and method (which are intended to be illustrative and not limiting), it is noted that modifications and variations can be made by persons skilled in the art considering the above teachings. It is therefore to be understood that changes may be made in the embodiments disclosed which are within the scope of the invention as outlined by the appended claims. Having thus described aspects of the invention, with the details and particularity required by the patent laws, what is claimed and desired protected by Letters Patent is set forth in the appended claims.

We claim as our invention:

1. A communications apparatus comprising:
   a composite signal comprising a desired signal and interferer signals, wherein the desired signal comprises desired symbols and the interferer signals comprise interferer symbols; and
   N frameworks, each framework comprising
      a detector to partition the desired symbols and the interferer symbols based on an interference severity into a dominant group and a non-dominant group, and to generate A Posteriori Probabilities (APP) of the desired symbols and the interferer symbols,
   wherein the detector of each of the N frameworks generates the APP based on a feedback of a priori probabilities from each of the N frameworks.

2. The communications apparatus of claim 1, wherein the detector of each of the N frameworks transforms the APP to a first Log-Likelihood Ratios (LLRs) using a bit-to-symbol mapping rule, and
   each of N frameworks further comprises
      a deinterleaver to deinterleave the first LLRs into a decoder input,
      a Forward Error Correcting (FEC) Decoder to decode the decoder input and to generate a second LLRs from a decoded decoder input, and
      an interleaver to interleave the second LLRs,
   wherein the second LLRs are treated as a priori probabilities for a respective N framework after the interleaver of the respective N framework, and
   the second LLRs of each of the N frameworks represent either the desired symbols or the interferer symbols.

3. The communications apparatus of claim 2, wherein the desired signal is more robust than each of the interferer signals, and the second LLRs from the FEC decoder of a first framework of the N frameworks represent the desired symbols.

4. The communications apparatus of claim 2, wherein at least one of the interferer signals is more robust than the desired signal, and the second LLRs from the FEC decoder of a framework other than a first framework of the N frameworks represent the desired symbols.

5. The communications apparatus of claim 4, wherein the desired symbols are recovered by Simultaneous Decoding (SD) or by Simultaneous Non-unique Decoding (SND).

6. The communications apparatus of claim 1, wherein the detector is selected from a Soft-In Soft-Out (SISO) detector, a Divide-And-Conquer (DAC) detector or a SISO DAC detector.

7. The communications apparatus of claim 1, wherein the communications apparatus is disposed in an SISO Iterative Divide and Conquer (IDAC) receiver and the detector is a SISO DAC detector.

8. The communications apparatus of claim 1, wherein the dominant group comprises an Optimal-Bayesian (OB) group via a probability mass function (pmf).

9. The communications apparatus of claim 1, wherein the non-dominant group comprises a Noise-Floor (NF) group incorporated via a power of each member and a Subtractive-Cancellation (SC) group incorporated via first- and second-order moments derived from the a priori probabilities, and the dominant group comprises an Optimal-Bayesian (OB) group incorporated via a probability mass function (pmf).

10. The communications apparatus of claim 9, wherein an output $$x[k] = |\gamma_{n_d}| \cdot a_{n_d,k}$$
$$+ \underline{h}_{I,n_d}^{(OB)}[k] \cdot \underline{a}_{I,n_d}^{(OB)}[k] + \underline{h}_{I,n_d}^{(SC)}[k] \cdot \underline{a}_{I,n_d}^{(SC)}[k]$$
$$+ \underline{h}_{I,n_d}^{(NF)}[k] \cdot \underline{a}_{I,n_d}^{(NF)}[k] + n[k]$$

where $\underline{a}_{I,n_d}[k]$ partitioned into three groups, $\underline{a}_{I,n_d}^{(NF)}[k]$, $\underline{a}_{I,n_d}^{(SC)}[k]$, $\underline{a}_{I,n_d}^{(OB)}[k]$, and $\underline{h}_{I,n_d}^{(NF)}[k]$, $\underline{h}_{I,n_d}^{(SC)}[k]$, $\underline{h}_{I,n_d}^{(OB)}[k]$ represents spatial and temporal CCI channel coefficients corresponding to the NF group, the SC group and the OB group, respectively.

11. The communications apparatus of claim 10, wherein the detector is mathematically expressed as $$P_{DAC}(a_{n_d,k}|x[k]) = \sum_{\underline{a}_{I,n_d}^{(OB)}[k]} p_{DAC}(x[k]|a_{n_d,k}, \underline{a}_{I,n_d}^{(OB)}[k], \underline{a}_{I,n_d}^{(SC)}[k], \underline{a}_{I,n_d}^{(NF)}[k]) \cdot$$
$$P(\underline{a}_{I,n_d}^{(OB)}[k]) \cdot P(a_{n_d,k}),$$

where pDAC(•) is $$p_{DAC}(x[k]|a_{n_d,k}, \underline{a}_{I,n_d}^{(OB)}[k], \underline{a}_{I,n_d}^{(SC)}[k], \underline{a}_{I,n_d}^{(NF)}[k]) =$$
$$\exp\left\{-\frac{|(x[k] - \hat{I}_{n_d}^{(SC)}[k]) - |\gamma_{n_d}| \cdot a_{n_d,k} - \underline{h}_{I,n_d}^{(OB)}[k] \cdot \underline{a}_{I,n_d}^{(OB)}[k]|^2}{\sigma_n^2 + c_{I,n_d}^{(SC)}[k] + c_{I,n_d}^{(NF)}[k]}\right\}$$

a likelihood function associated with observing x[k], P(•) is the a priori probabilities corresponding to the second LLRs representing the desired symbols, $\hat{I}_{n_d}^{(SC)}[k] = \underline{h}_{I,n_d}^{(SC)}[k] \cdot \mathbb{E}$ {

$\underline{a}_{I,n_d}^{(SC)}[k]\}$, $c_{I,n_d}^{(SC)}[k] \cdot \text{Cov} \{\underline{a}_{I,n_d}^{(SC)}[k]\} \cdot (\underline{h}_{I,n_d}^{(SC)}[k])^H$, and $c_{I,n_d}^{(NF)}[k] = \underline{h}_{I,n_d}^{(NF)}[k] \cdot (\underline{h}_{I,n_d}^{(NF)}[k])^H$.

12. The communications apparatus of claim 1, wherein a count of the N frameworks is selected from one (1), two (2) or three (3).

13. The communications apparatus of claim 1, wherein the desired signal and the interferer signals comprise DVB-S2X standard compliant signals.

14. A computer implemented method comprising:
   providing a composite signal comprising a desired signal and interferer signals, wherein the desired signal comprises desired symbols and the interferer signals comprise interferer symbols; and
   iteratively computing, N frameworks, each framework comprising
      partitioning the desired symbols and the interferer symbols based on an interference severity into a dominant group and a non-dominant group, and
      generating A Posteriori Probabilities (APP) of the desired symbols and the interferer symbols,
   wherein the detector of each of the N frameworks generates the APP based on a feedback of a priori probabilities from each of the N frameworks.

15. The method of claim 14, wherein the detector of each of the N frameworks transforms the APP to a first Log-Likelihood Ratios (LLRs) using a bit-to-symbol mapping rule, and
   the iteratively computing further comprises:
      deinterleaving the first LLRs into a decoder input,
      decoding the decoder input,
      generating a second LLRs from a decoded decoder input and
      interleaving the second LLRs,
   wherein the second LLRs are treated as a priori probabilities for a respective N framework after the interleaver of the respective N framework, and
   the second LLRs of each of the N frameworks represent either the desired symbols or the interferer symbols.

16. The method of claim 15, wherein the desired signal is more robust than each of the interferer signals, and the second LLRs from the decoding of a first framework of the N frameworks represent the desired symbols.

17. The method of claim 15, wherein at least one of the interferer signals is more robust than the desired signal, and the second LLRs from the decoding of a framework other than a first framework of the N frameworks represent the desired symbols.

18. The method of claim 14, wherein the non-dominant group comprises a Noise-Floor (NF) group incorporated via a power of each member and a Subtractive-Cancellation (SC) group incorporated via first- and second-order moments derived from the a priori probabilities, and the dominant group comprises an Optimal-Bayesian (OB) group incorporated via a probability mass function (pmf).

19. The method of claim 18, wherein an output x[k] is, $$x[k] = |\gamma_{n_d}| \cdot a_{n_d,k}$$
$$+ \underline{h}_{I,n_d}^{(OB)}[k] \cdot \underline{a}_{I,n_d}^{(OB)}[k] + \underline{h}_{I,n_d}^{(SC)}[k] \cdot \underline{a}_{I,n_d}^{(SC)}[k]$$
$$+ \underline{h}_{I,n_d}^{(NF)}[k] \cdot \underline{a}_{I,n_d}^{(NF)}[k] + n[k]$$

where $a_{I,n_d}[k]$ is partitioned into three groups, $\underline{a}_{I,n_d}^{(NF)}[k]$, $\underline{a}_{I,n_d}^{(SC)}[k]$, $\underline{a}_{I,n_d}^{(OB)}[k]$, and $\underline{h}_{I,n_d}^{(NF)}[k]$, $\underline{h}_{I,n_d}^{(SC)}[k]$, $\underline{h}_{I,n_d}^{(OB)}[k]$ represents spatial and temporal CCI channel coefficients corresponding to the NF group, the SC group and the OB group, respectively.

20. The method of claim 19, wherein the detector is mathematically expressed as $$P_{DAC}(a_{n_d,k} | x[k]) = \sum_{\underline{a}_{I,n_d}^{(OB)}[k]} p_{DAC}(x[k] | a_{n_d,k}, \underline{a}_{I,n_d}^{(OB)}[k], \underline{a}_{I,n_d}^{(SC)}[k], \underline{a}_{I,n_d}^{(NF)}[k]) \cdot$$
$$P(\underline{a}_{I,n_d}^{(OB)}[k]) \cdot P(a_{n_d,k}),$$

where pDAC(•) is $$p_{DAC}(x[k] | a_{n_d,k}, \underline{a}_{I,n_d}^{(OB)}[k], \underline{a}_{I,n_d}^{(SC)}[k], \underline{a}_{I,n_d}^{(NF)}[k]) =$$
$$\exp\left\{ -\frac{\left|(x[k] - \hat{I}_{n_d}^{(SC)}[k]) - |\gamma_{n_d}| \cdot a_{n_d,k} - \underline{h}_{I,n_d}^{(OB)}[k] \cdot \underline{a}_{I,n_d}^{(OB)}[k]\right|^2}{\sigma_n^2 + c_{I,n_d}^{(SC)}[k] + c_{I,n_d}^{(NF)}[k]} \right\}$$

a likelihood function associated with observing x[k], PH is the a priori probabilities corresponding to the second LLRs representing the desired symbols, $\hat{I}_{n_d}^{(SC)}[k] = \underline{h}_{I,n_d}^{(SC)}[k] \cdot \mathbb{E}\{\underline{a}_{I,n_d}^{(SC)}[k]\}$, $c_{I,n_d}^{(SC)}[k] \cdot \text{Cov}\{\underline{a}_{I,n_d}^{(SC)}[k]\} \cdot (\underline{h}_{I,n_d}^{(SC)}[k])^H$, and $c_{I,n_d}^{(NF)}[k] = \underline{h}_{I,n_d}^{(NF)}[k] \cdot (\underline{h}_{I,n_d}(NF)[k])^H$.

* * * * *